(12) United States Patent
Saeki

(10) Patent No.: US 6,275,547 B1
(45) Date of Patent: Aug. 14, 2001

(54) CLOCK RECOVERY CIRCUIT

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/154,037

(22) Filed: Sep. 16, 1998

(30) Foreign Application Priority Data

Sep. 18, 1997 (JP) .................................................. 9-253200

(51) Int. Cl.[7] ................................ H04L 7/00; H03L 7/00
(52) U.S. Cl. .......................... 375/354; 327/161; 713/401
(58) Field of Search .................................... 375/354, 355, 375/377, 373; 327/153, 161, 165, 269, 271, 276, 277, 284; 713/400, 401, 500, 600; 370/503, 517, 518

(56) References Cited

U.S. PATENT DOCUMENTS

| 4,975,929 | * | 12/1990 | Apple et al. | 375/373 |
| 5,592,519 | * | 1/1997 | Honaker, Jr. | 375/373 |

OTHER PUBLICATIONS

M. Banu et al., "Clock Recovery Circuits With Instantaneous Locking", Electronics Letters, vol. 28, No. 23, Nov. 5, 1992, pp. 2127–2130.
M. Nakamura et al., "A 156 Mbps CMOS Clock Recovery Circuit for Burst–Mode Transmission", Symposium on VLSI Circuits Digest of Technical Papers, 1996, pp. 122–123.

* cited by examiner

Primary Examiner—Stephen Chin
Assistant Examiner—Betsy L. Deppe
(74) Attorney, Agent, or Firm—Sughrue, Mion, Zinn, Macpeak & Seas, PLLC

(57) ABSTRACT

A clock recovery circuit capable of shortening time needed to obtain a synchronized state includes a first synchronous delay circuit to which a reference clock and data are input and which outputs a first clock, and a second synchronous delay circuit to which the reference clock and a signal obtained by inverting the data by an inverter are input and which outputs a second clock. The first and second clocks are combined by a pulse combining circuit for producing an extracted clock. The extracted clock serves as the latch timing of a latch circuit.

16 Claims, 6 Drawing Sheets

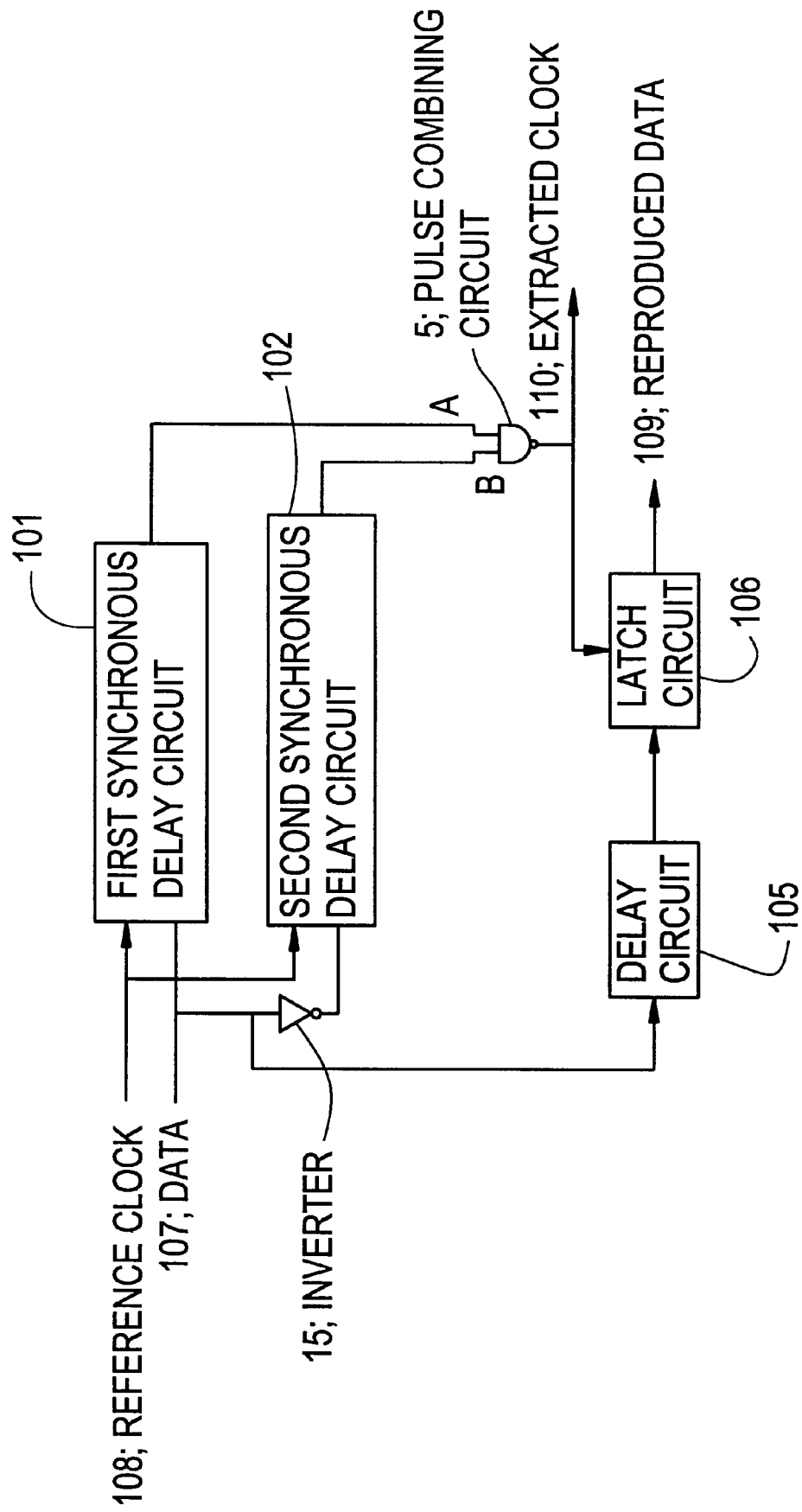

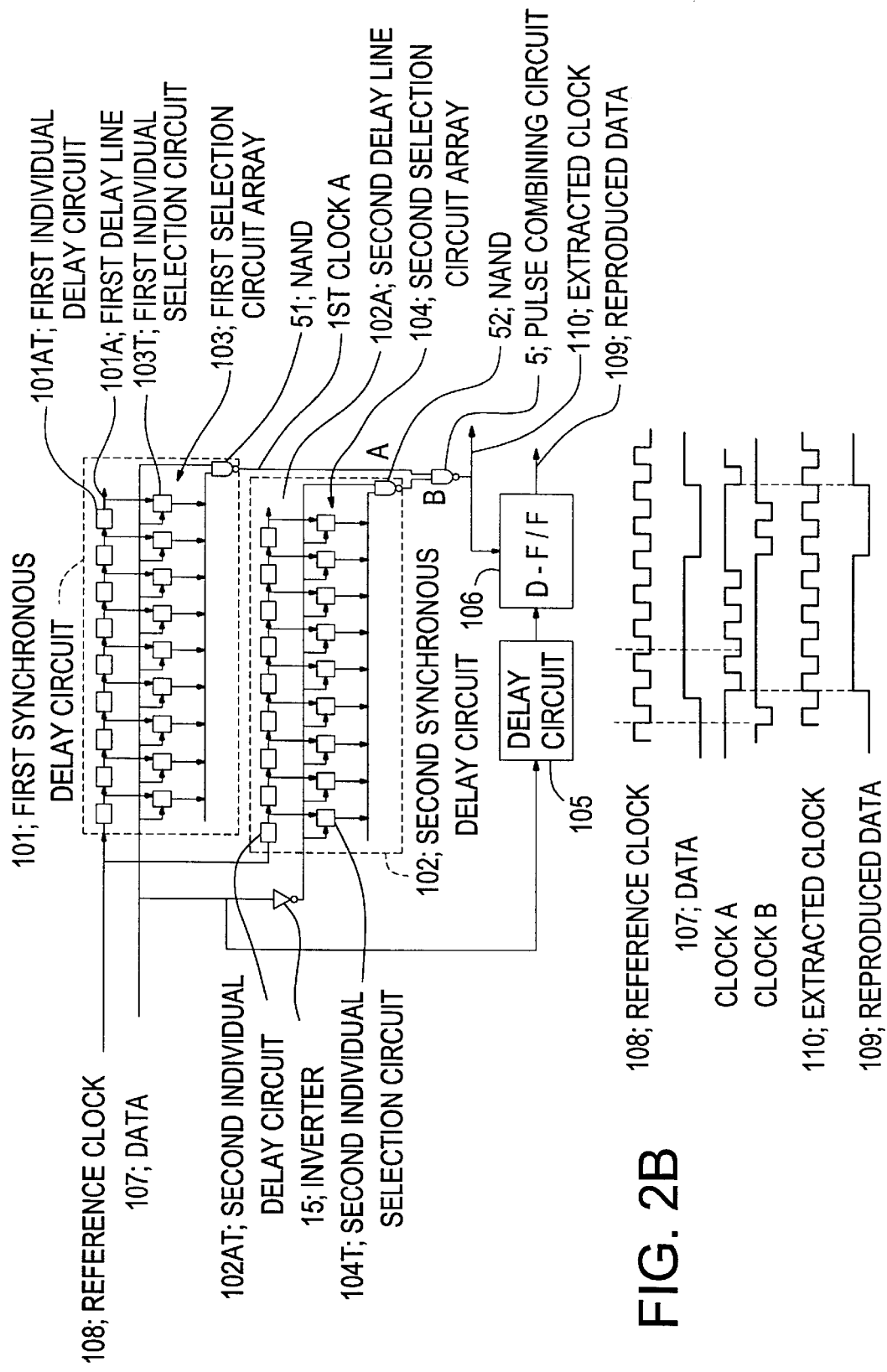

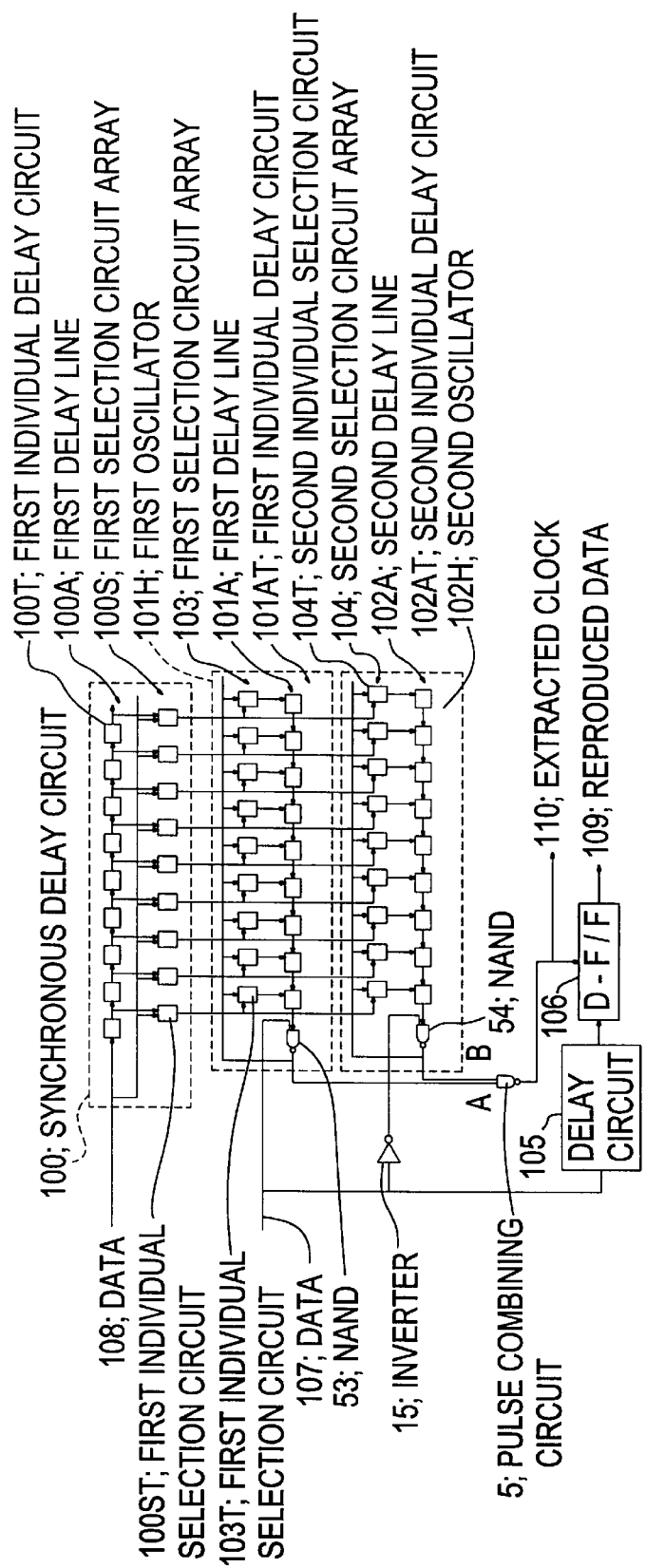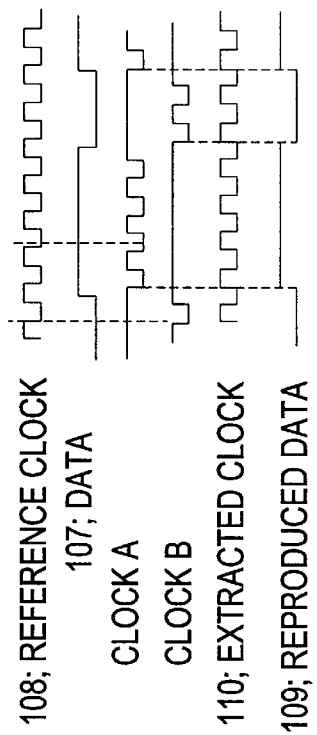
FIG. 4A
FIG. 4B

CLOCK RECOVERY CIRCUIT

FIELD OF THE INVENTION

This invention relates to a clock recovery circuit and, more particularly, to a clock recovery circuit for shortening data and clock synchronization time.

BACKGROUND OF THE INVENTION

In order to perform burst-mode transition in the prior art, use is made of a clock recovery circuit for generating a clock that is accurately synchronized to data. A clock recovery circuit for such burst-mode transmission according to the prior art will be described with reference to FIG. 6, which is a block diagram illustrating the conventional clock recovery circuit.

The clock recovery circuit depicted in FIG. 6 is disclosed in Electronics Letters, Nov. 5, 1992, Vol.28, No 23, pp. 2127–2129. As shown in FIG. 6, the clock recovery circuit comprises a delay circuit (Delay) 305 to which data 301 is input; a gate-input controlled oscillator (GVCO) 307 to which the data 301 is input; an inverter 315 for inverting the data 301, which is input thereto; a gate-input controlled oscillator (GVCO) 309 to which the inverted data output by the inverter 315 is input; a multiplexing circuit (MUX) 308 for combining the outputs of the gate-input controlled oscillators 307, 309 and outputting the resulting signal as an extracted clock; a data-type flip-flop (referred as a "D-F/F" below) 306 having a data terminal to which the extracted clock 303 output by the multiplexing circuit 308 is input, whereby the delayed data 301 output by the delay circuit 305 is latched and output as reproduced data 302; a phase detecting circuit (PD) 311 to which a reference clock 304 is input; and a loop filter (LF)/charge pump (CP) 312 to which a signal output by the phase detecting circuit 311 is input and from which an output signal is delivered to the gate-input controlled oscillators 307,309 and to a gate-input controlled oscillator (GVCO)310, the latter delivering its output signal to the phase detecting circuit 311 based upon the signal output by the loop filter/charge pump 312.

The phase detecting circuit 311, loop filter/charge pump 312 and gate-input controlled oscillator 310 in this clock recovery circuit construct a phase-locked loop (referred to as a "PLL" below).

Thus, the clock recovery circuit shown in FIG. 6 is constituted by a PLL the basic components of which are the single loop filter/charge pump 312, the single phase detecting circuit 311, the single multiplexing circuit 308, the single delay circuit 305, the single D-F/F 306 serving as a latch circuit, and the three gate-input controlled oscillators 307, 309,310.

The operation of the conventional clock recovery circuit shown in FIG. 6 will now be described.

In terms of the connections, an ordinary PLL is constructed by the loop filter/charge pump 312, phase detecting circuit 311 and one gate-input controlled oscillator 310. The reference clock 304 is input to the phase detecting circuit 311, which becomes synchronized to the reference clock 304 and delivers its output to the loop filter/charge pump 312. The output signal from the loop filter/charge pump 312 enters the gate-input controlled oscillators 307, 309 and 310. Accordingly, the outputs of the gate-input controlled oscillators 307 and 309 are synchronized to the reference clock 304 at all times.

The timings of the various signals associated with the conventional clock recovery circuit shown in FIG. 6 will be described with reference to FIG. 7, which is a timing chart illustrating these signals.

As shown in FIG. 7, the gate-input controlled oscillator 307 outputs a clock A in conformity with the rising edge of the data 301 and the gate-input controlled oscillator 309 outputs a clock B in conformity with the falling edge of the data 301. The two clocks A and B are multiplexed by the multiplexing circuit 308, whereby the extracted clock 303 is produced. Further, owing to the input of the extracted clock 303 to the its data terminal, the D-F/F 306 latches the data 301 that has passed through the delay circuit 305 and generates the reproduced data 302. As a result, the extracted clock 303 synchronized to the data and the reproduced data 302 can be obtained with the clock recovery circuit according to the prior art illustrated in FIG. 6.

Further, a clock recovery circuit employing a similar technique using the data 301 instead of the reference clock 304 has been disclosed in the 1996 Symposium on VLSI Circuits Digest of Technical Papers, pp. 122–123.

SUMMARY OF THE DISCLOSURE

A problem with the conventional clock recovery circuits is that it is required that the single gate-input controlled oscillator 307 and single gate-input controlled oscillator 309 in the PLL be held in the synchronized state. As a result, it is required that the system wait for several dozen clock pulses or more until the synchronized state is obtained. This makes it difficult shorten synchronization time.

Accordingly, an object of the present invention is to provide a clock recovery circuit in which it is possible to shorten the time needed to obtain synchronization.

Further objects of the present invention will become apparent in the entire disclosure.

According to a first aspect of the present invention, the foregoing object is attained by providing a clock recovery circuit comprising: a first synchronous delay circuit (generally termed as "synchronous multi-step delay circuit"), to which a reference clock and data are input, for outputting a first clock; an inverter for inverting the data and then outputting inverted data; a second synchronous delay circuit, to which the reference clock and the inverted data that is output by the inverter are input, for outputting a second clock; a delay circuit, to which the data is input, for outputting this input data upon delaying it; a pulse combining circuit, to which the first clock output by the first synchronous delay circuit and the second clock output by the second synchronous circuit are input, for combining these input clocks and outputting the result as an extracted clock; and a data-type flip-flop, having a data terminal to which the extracted clock output by the pulse combining circuit is input, in response to which the data-type flip-flop latches the data that has been delayed in the delay circuit and outputs the latched data as reproduced data.

The first synchronous delay circuit has (1) a first delay line, to which the reference clock is input, made up by at least one first individual delay circuit; (2) a first selection circuit array made up by at least one second individual selection circuit to which the reference clock output by a respective one of the first individual delay circuits making up the first delay line is input and which is rendered conductive based upon the data (to provide a first generated reference clock); and (3) a first NAND gate, to which the data and the (first generated) reference clock that is output by the first selection circuit array are input, for outputting a first clock.

The second synchronous delay circuit has (1) a second delay line, to which the reference clock is input, made up by at least one third individual delay circuit; (2) a second selection circuit array made up by at least one fourth individual selection circuit to which the reference clock output by a respective one of the third individual delay circuits making up the second delay line is input and which is rendered conductive based upon the inverted data (to provide a second generated reference clock); and (3) a second NAND gate, to which the data inverted by the inverter and the (second generated) reference clock that is output by the second selection circuit array are input, for outputting a second clock.

In accordance with the first aspect of the present invention, therefore, the reference clock is delayed by being input to the first delay line of the first synchronous delay circuit. By inputting the data to the first selection circuit array of the first synchronous delay circuit, the delayed reference clock is synchronized to the rising edge of the data and output as a first clock if the data is at the high logic level. By inputting the reference clock to the second delay line of the second synchronous delay circuit, the reference clock is delayed. By inputting the inverted data inverted by the inverter to the second selection circuit array of the second synchronous delay circuit, the delayed reference clock is synchronized to the falling edge of the data and output as a second clock if the data is at the low logic level, i.e., if the inverted data is at the high logic level. The extracted clock is obtained by combining the first and second clocks using the pulse combining circuit. On the basis of the extracted clock, the data-type flip-flop latches the data delayed by the delay circuit and outputs the latched data as reproduced data. This makes it possible to shorten the time needed for clock synchronization.

The actions of the first aspect of the present invention will now be described in further detail.

Because the first and second synchronous delay circuits are provided, there are two delay lines that fix a delay time difference that is equal to the time difference between the two inputs to each synchronous delay circuit. One input of the two inputs is the reference clock and the other input is the data. The time difference between the reference clock and the rising edge of the data is fixed by one output of the two delay line outputs and the time difference between the reference clock and the falling edge of the data is fixed by the other output of the two delay line outputs, and a suitable time delay is applied to the reference clock. As a result, clock pulses that are in phase with the edges of the data are generated during each of the high and low levels of the data, the generated pulses are combined to obtain the extracted clock and the data is reproduced.

In a preferred embodiment, the pulse combining circuit is constituted by a third NAND gate.

In accordance with this embodiment, the effects of the first aspect of the invention are obtained and, in addition, the pulse combining circuit is constituted by a third NAND. As a result, the combining of the first and second clocks can be executed more accurately and with greater ease.

According to a second aspect of the present invention, there is provided a clock recovery circuit comprising: a first synchronous delay circuit, to which a reference clock and data are input, for outputting a first clock; an inverter for inverting the data and then outputting inverted data; a second synchronous delay circuit, to which the reference clock and the inverted data that is output by the inverter are input, for outputting a second clock, for outputting a second clock; a delay circuit, to which the data is input, for outputting this input data upon delaying it; a pulse combining circuit, to which the first clock output by the first synchronous delay circuit and the second clock output by the second synchronous circuit are input, for combining these input clocks and outputting the result as an extracted clock; and a data-type flip-flop, having a data terminal to which the extracted clock output by the pulse combining circuit is input, in response to which the data-type flip-flop latches the data that has been delayed in the delay circuit and outputs the latched data as reproduced data.

The first synchronous delay circuit has an 11th delay line, to which the reference clock is input, constituted by at least one fifth individual delay circuit; a first selection circuit array constituted by at least one sixth individual selection circuit to which the reference clock as well as the reference clock output by a respective one of the fifth individual delay circuits constituting the 11th delay line is input and which is rendered conductive based upon the data to provide a first generated reference clock; a 12th delay line, to which the clock output by each sixth individual selection circuit constituting the first selection circuit array is input, constituted by at least one seventh individual delay circuit; and a first NAND gate to which the data and the (first generated) reference clock that is output by the 12th delay line are input.

The second synchronous delay circuit has a 21st delay line, to which the reference clock is input, constituted by at least one eighth individual delay circuit; a second selection circuit array constituted by at least one ninth individual selection circuit to which the reference clock as well as the reference clock output by a respective one of the eighth individual delay circuits constituting the 12th delay line is input and which is rendered conductive based upon the inverted data inverted by the inverter (to provide a second generated reference clock); a 22nd delay line, to which the reference clock output by each ninth individual selection circuit constituting the second selection circuit array is input, constituted by at least one tenth individual delay circuit; and a second NAND gate to which the data inverted by the inverter and the reference clock that is output by the 22nd delay line are input.

In accordance with the second aspect of the present invention, therefore, the reference clock is delayed by inputting the reference clock to the 11th delay line of the first synchronous delay circuit. By inputting data to the first selection circuit array, the delayed reference clock is output via the 12th delay line as the first clock of a clock that corresponds to the rising edge of the data. Further, the reference clock is delayed by being to the 21st delay line of the second synchronous delay circuit. By inputting the data inverted by the inverter to the second selection circuit array, a reference clock synchronized to the falling edge of the data, namely to the rising edge of the inverted data, is output via the 22nd delay line as a second clock. The first clock and the second clock are combined in the pulse combining circuit and the resulting signal is output as the extracted clock. By outputting the extracted clock to the data terminal of the data-type flipflop, the latter latches the data delayed in the delayed circuit and outputs the latched data as reproduced data. This makes it possible to shorten the time needed for clock synchronization.

The actions of the second aspect of the present invention will now be described in further detail.

Because the first and second synchronous delay circuits are provided, there are two delay circuits each comprising oppositely directed delay lines which function to fix a delay time difference that is equal to the time difference between the two inputs of each synchronous delay circuit. One input of the two inputs is the reference clock and the other input is the data. One output of the two delay circuit outputs is enabled when the data is at the high level and the other output of the two delay circuit outputs is enabled when the data is at the low level. The time differences between the reference clock and the rising and falling edges of the data are fixed and a suitable time delay is applied to the reference clock. As a result, clock pulses that are in phase with the edges of the data aregenerated during each of the high and low levels of the data, and the generated pulses are combined to obtain the extracted clock, whereby the data is reproduced. In a preferred embodiment, the pulse combining circuit is constituted by a third NAND gate.

In accordance with this embodiment, the effects of the second aspect of the invention are obtained and, in addition, the pulse combining circuit is constituted by a third NAND. As a result, the combining of the first and second clocks can be executed more accurately and with greater ease.

According to a third aspect of the present invention, there is provided a clock recovery circuit comprising: a synchronous delay circuit to which a reference clock is input; a first oscillator, to which data is input, for outputting a first clock; an inverter for inverting the data and then outputting inverted data; a second oscillator, to which the inverted data output by the inverter is input, for outputting a second clock; a pulse combining circuit for combining the first clock output by the first oscillator and the second clock output by the second oscillator and outputting the result as an extracted clock; a delay circuit, to which the data is input, for outputting this input data upon delaying it; and a data-type flip-flop, having a data terminal to which the extracted clock output by the pulse combining circuit is input, in response to which the data-type flip-flop latches the data that has been delayed in the delay circuit and outputs the latched data as reproduced data.

The synchronous delay circuit has a first delay line, to which the reference clock is input, constituted by at least one 11th (first) individual delay circuit; and a first selection circuit array constituted by at least one 12th (first) individual selection circuit to which the reference clock as well as the reference clock output by a respective one of the 11th individual delay circuits constituting the first delay line is input.

The first oscillator has an 11th (first) selection circuit array, to which the reference clock output by each 12th (first) individual selection circuit constituting the first selection circuit array is input, constituted by at least one 13th (first) individual selection circuit; an 11th (first) delay line, to which the reference clock output from each 13th (first) individual selection circuit constituting the 11th (first) selection circuit array is input, constituted by at least one 14th (first) individual delay circuit; and a first NAND gate, to which the data and the reference clock that is output by the 11th (first) delay line are input, for outputting a first clock to each 13th (first) individual selection circuit constituting the 11th (first) selection circuit array and to the pulse combining circuit.

The second oscillator has a 12th (second) selection circuit array, to which the reference clock output by each 12th (second) individual selection circuit constituting the first selection circuit array is input, constituted by at least one 15th (second) individual selection circuit; a 12th (second) delay line, to which the reference clock output from each 15th (second) individual selection circuit constituting the 12th (second) selection circuit array is input, constituted by at least one 16th (second) individual delay circuit; and a second NAND gate, to which the inverted data inverted by the inverter and the reference clock that is output by the 12th (second) delay line are input, for outputting a second clock to each 15th (second) individual selection circuit constituting the 12th selection circuit array and to the pulse combining circuit.

In accordance with the third aspect of the present invention, therefore, the reference clock is delayed by being input to the first delay line of the synchronous delay circuit. By inputting the reference clock to the first selection circuit array of the synchronous delay circuit, the delayed reference clock is output by the first delay line. The delayed reference clock output by the first selection circuit array of the synchronous delay circuit is output to the 11th selection circuit array of the first oscillator, and the output signal from the 11th selection circuit array is input to the 11th delay line of the first oscillator, whereby the first clock is output by the first oscillator. Similarly, the delayed reference clock output by the first selection circuit array is output to the 12th selection circuit array of the second oscillator, and the output signal from the 12th selection circuit array is input to the 12th delay line of the second oscillator, whereby the second clock is output by the second oscillator. The first clock and the second clock are combined in the pulse combining circuit and the resulting signal is output as the extracted clock. By inputting the extracted clock to the data terminal of the data-type flip-flop, the latter latches the data delayed in the delayed circuit and outputs the latched data as reproduced data. This makes it possible to shorten the time needed for clock synchronization. The actions of the third aspect of the present invention will now be described in further detail.

Because the synchronous delay circuit and the first and second oscillators are provided, there are two delay lines that fix a delay time difference that is equal to the time difference between two inputs comprising successive clock pulses, and two oscillators in which the numbers of structural elements are decided thereby. One oscillator is enabled when the data is at the high logic level, the other oscillator is enabled when the data is at the low logic level, and clock pulses synchronized to the edges of the data are generated.

In a preferred embodiment, the pulse combining circuit is constituted by a third NAND.

In accordance with this embodiment, the effects of the third aspect of the invention are obtained and, in addition, the pulse combining circuit is constituted by a third NAND. As a result, the combining of the first and second clocks can be executed more accurately and with greater ease.

According to a fourth aspect of the present invention, there is provided a clock recovery circuit comprising: a synchronous delay circuit to which data is input; a first oscillator, to which the data is input, for outputting a first clock; an inverter, to which the data is input, for outputting inverted data; a second oscillator, to which the inverted data output by the inverter is input, for outputting a second clock; a pulse combining circuit, to which the first clock output by the first oscillator and the second clock output by the second oscillator are input, for combining these two input clocks and outputting the result as an extracted clock; a delay circuit, to which the data is input, for outputting this input data upon delaying it; and a data-type flip-flop, having a data terminal to which the extracted clock output by the pulse combining circuit is input, in response to which the data-type flipflop latches the delayed data output by the delay circuit and outputs the latched data as reproduced data.

The synchronous delay circuit has a first delay line, to which the data is input, constituted by at least one 17th (first)

individual delay circuit; and a first selection circuit array constituted by at least one 18th (first) individual selection circuit to which the data as well as the data output by each 17th (first) individual delay circuit constituting the first delay line is input The first oscillator has an 11th (first) selection circuit array, to which the data output by each 18th (first) individual selection circuit constituting the first selection circuit array is input, constituted by at least one 19th (first) individual selection circuit; two 11th (first) delay lines, to which the data output from each 19th individual selection circuit constituting the 11th (first) selection circuit array is input, constituted by at least one 20th (first) individual delay circuit; and a first NAND gate, to which the data as well as the data that is output by the two 11th (first) delay lines is input, for outputting a first clock to each 19th (first) individual selection circuit constituting the 11th (first) selection circuit array and to the pulse combining circuit.

The second oscillator has a 12th (second) selection circuit array, to which the data output by each 18th (second) individual selection circuit constituting the first selection circuit array is input, constituted by at least one 21st (second) individual selection circuit; two 12th (second) delay lines, to which the data output from each 21st (second) individual selection circuit constituting the 12th (second) selection circuit array is input, constituted by at least one 22nd (second) individual delay circuit; and a second NAND gate, to which the inverted data inverted by the inverter as well as the data that is output by the two 12th (second) delay lines is input, for outputting a second clock to each 21st (second) individual selection circuit constituting the 12th (second) selection circuit array and to the pulse combining circuit.

In accordance with the fourth aspect of the present invention, therefore, the data is delayed by being input to the first delay line of the synchronous delay circuit. By inputting the data to the first selection circuit array of the synchronous delay circuit, the delayed data is output by the first delay line. The delayed data output by the first selection circuit array of the synchronous delay circuit is input to the 11th selection circuit array of the first oscillator, and the delayed data output by the 11th selection circuit array is input to the 11th delay line, whereby the first clock is output by the first oscillator. Similarly, the delayed data output by the first selection circuit array of the synchronous delay circuit is input to the 12th selection circuit array of the second oscillator, and the delayed data output by the 12th selection circuit array is input to the 12th delay line, whereby the second clock is output by the second oscillator. The first clock and the second clock are combined by the pulse combining circuit and the resulting signal is output as the extracted clock. Furthermore, on the basis of the extracted clock input to the data terminal of the data-type flip-flop, the data delayed in the delayed circuit is latched and output as reproduced data. This makes it possible to shorten the time needed for clock synchronization.

The actions of the fourth aspect of the present invention will now be described in further detail.

Because the synchronous delay circuit and the first and second oscillators are provided, there are two delay lines that fix a delay time difference that is equal to the time difference between two inputs comprising successive clock pulses, and two oscillators in which the numbers of structural elements are decided thereby. One oscillator is enabled when the data is at the high logic level, the other oscillator is enabled when the data is at the low logic level, and clock pulses synchronized to the edges of the data aregenerated.

In a preferred embodiment, the pulse combining circuit is constituted by a third NAND gate.

In accordance with this embodiment, the effects of the fourth aspect of the invention are obtained and, in addition, the pulse combining circuit is constituted by a third NAND. As a result, the combining of the first and second clocks can be executed more accurately and with greater ease.

According to a fifth aspect of the present invention, there is provided a clock recovery circuit comprising:

(a) a first synchronous delay circuit, to which a data signal is input, for outputting a first clock (A);

(b) an inverter inverting the data signal and then outputting an inverted data signal;

(c) a second synchronous delay circuit, to which the inverted data signal is input, for outputting a second clock (B);

(d) a delay circuit, to which the data signal is input, for outputting this input data signal upon delaying;

(e) a pulse combining circuit, to which the first clock (A) and the second clock (B) are input, for combining these input clocks and outputting the result as an extracted clock; and (f) a data-type flip-flop, having a data terminal to which the extracted clock output by said pulse combining circuit is input, in response to which the data-type flipflop latches the data signal that has been delayed in the delay circuit and outputs the latched data signal as a reproduced data signal;

(g) wherein the first and second synchronous delay circuits are mutually complementary synchronous multistep delay circuits outputting first and second output signals synchronized with the data signal during a period of time which corresponds to the first state and second state of the data signal, respectively, as a pulse signal having a pulse period substantially shorter than the minimal period of the states of said data signal so as to minimize the time period needed to reach synchronization.

In this aspect, the synchronous delay circuits receive a reference clock for synchronization having the pulse period of the pulse signal. Preferably, the pulse period of the pulse signal is a half of the minimal period of the states of the data signal.

It is preferred that each of the synchronous multi-step delay circuits comprises an array of individual delay circuits, each step of which is connected to a corresponding step of an array of individual selection circuits.

The data signal is supplied to each step of the array of the individual selection circuits to allow any of this step to output a generated reference clock which is supplied to a NAND which further receives the data signal and outputs any of the first and second clocks (A, B), respectively.

The array of individual selection circuits may be connected in the same order as the array of individual delay circuits. Alternatively, the array of individual selection circuits may be connected in an order opposite to the array of individual delay circuits.

According to a sixth aspect of the present invention, there is provided a clock recovery circuit comprising:

(a) a synchronous multi-step delay circuit to which a reference clock is input;

(b) a first oscillator, to which a data signal is input, for outputting a first clock (A);

(c) an inverter inverting the data signal and then outputting an inverted data signal;

(d) a second oscillator, to which the inverted data signal output by the inverter is input, for outputting a second clock (B);

(e) a pulse combining circuit for combining the first clock (A) output by said first oscillator and the second clock (B) output by the second oscillator and outputting the result as an extracted clock;

(f) a delay circuit, to which the data signal is input, for outputting this input data signal upon delaying; and (g) a data-type flip-flop, having a data terminal to which the extracted clock output by the pulse combining circuit is input, in response to which the data-type flipflop latches the data signal that has been delayed in the delay circuit and outputs the latched data signal as a reproduced data signal.

In this aspect, the synchronous multi-step delay circuit comprises an array of individual delay circuits, each step of which provides a generated reference clock to be supplied to each step of the first and second oscillators.

The first and second oscillators are mutually complementary synchronous oscillators outputting first and second output signals synchronized with the data signal during a period of time which corresponds to the first state and second state of the data signal, respectively, as a pulse signal having a pulse period substantially shorter than the minimal period of the states of the data signal so as to minimize the time period needed to reach synchronization.

According to a seventh aspect of the present invention, there is provided a clock recovery circuit comprising:

(a) a synchronous multi-step delay circuit to which a data signal is input;

(b) a first oscillator, to which the data signal is input, for outputting a first clock (A);

(c) an inverter, to which the data signal is input, for outputting an inverted data signal;

(d) a second oscillator, to which the inverted data signal output by the inverter is input, for outputting a second clock (B);

(e) a pulse combining circuit, to which the first clock (A) and the second clock (B) are input, for combining these two input clocks and outputting the result as an extracted clock;

(f) a delay circuit, to which the data signal is input, for outputting this input data signal upon delaying; and (g) a data-type flip-flop, having a data terminal to which the extracted clock output by the pulse combining circuit is input, in response to which the data-type flip-flop latches the delayed data signal output by the delay circuit and outputs the latched data as reproduced data signal.

In this aspect, the synchronous multi-step delay circuit comprises an array of individual delay circuits, each step of which provides a generated reference clock to be supplied to each step of the first and second oscillators.

The first and second oscillators are mutually complementary synchronous oscillators outputting first and second output signals synchronized with the data signal during a period of time which corresponds to the first state and second state of the data signal, respectively, as a pulse signal having a pulse period substantially shorter than the minimal period of the states of the data signal so as to minimize the time period needed to reach synchronization.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a block diagram illustrating a mode of practicing a clock recovery circuit according to the present invention;

FIG. 2A is a circuit diagram illustrating a first embodiment of a clock recovery circuit according to the present invention;

FIG. 2B is a timing chart of various signals associated with the clock recovery circuit shown in FIG. 2A;

FIG. 4A is a circuit diagram illustrating a third embodiment of a clock recovery circuit according to the present invention;

FIG. 4B is a timing chart of various signals associated with the clock recovery circuit shown in FIG. 4A;

DESCRIPTION OF THE PREFERRED EMBODIMENTS

Figure 3A:
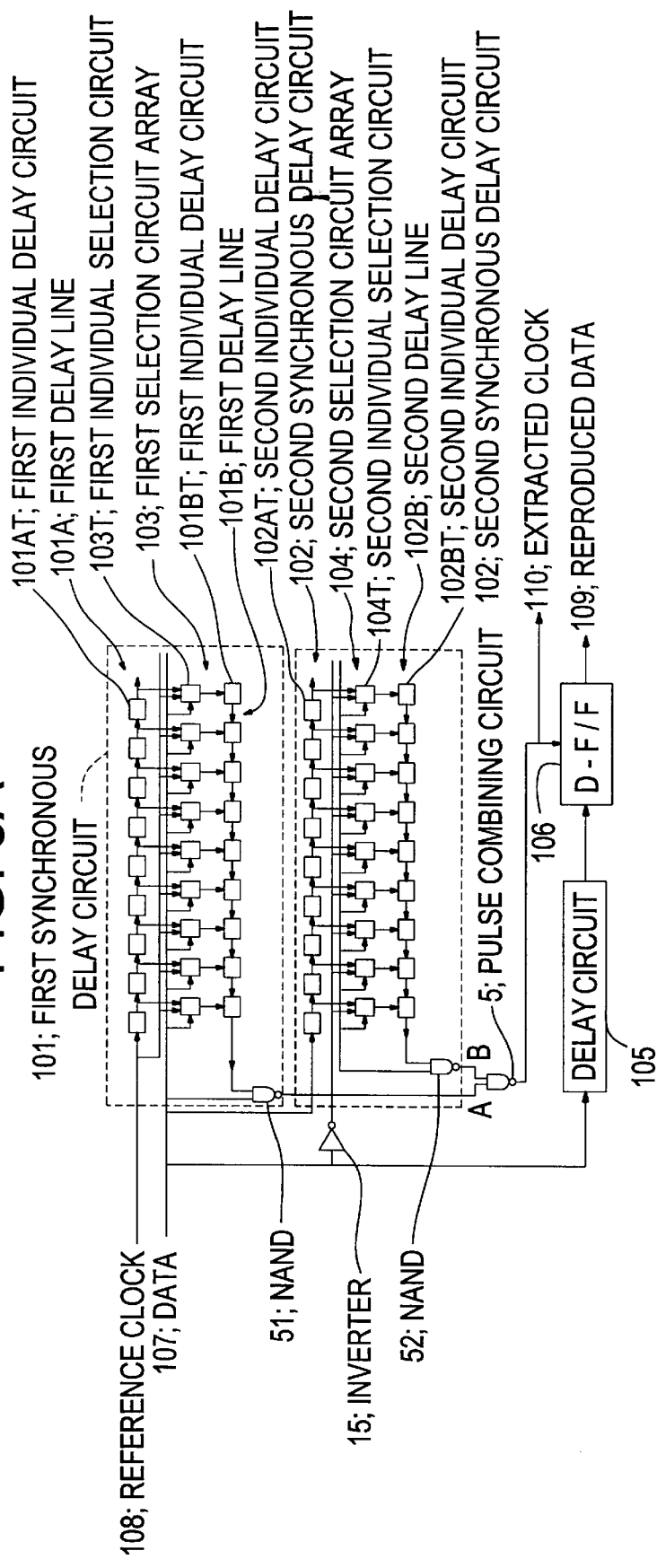
FIG. 3A is a circuit diagram illustrating a second embodiment of a clock recovery circuit according to the present invention.

A mode of practicing a clock recovery circuit according to the present invention will now be described with reference to the drawings.

FIG. 1 is a block diagram illustrating the construction of first and second embodiments (described later) of a clock recovery circuit according to the present invention.

As shown in FIG. 1, the clock recovery circuit includes a first synchronous delay circuit 101, to which a reference clock 108 and data 107 are input, for outputting a first clock A to a pulse combining circuit 5; an inverter 15, to which the data 107 is input, for inverting the data 107 and outputting the inverted data; a second synchronous delay circuit 102, to which the reference clock 108 and inverted data that is output by the inverter are input, for outputting a second clock B to the pulse combining circuit 5; a delay circuit 105, to which the data 107 is input, for outputting the input data 107 to a latch circuit 106 upon delaying the data; the pulse combining circuit 5, to which the first clock A output by the first synchronous delay circuit 101 and the second clock B out put by the second synchronous circuit 102 are input, for combining these input clocks and outputting the result as an extracted clock 110; and the latch circuit 106 which, on the basis of the signal output by the pulse combining circuit 5, latches the delayed signal output by the delay circuit 105 and outputs reproduced data 109.

Thus, the clock recovery circuit is so adapted that the data 107 enters the first synchronous delay circuit 101 and is also inverted by the inverter 15 before entering the second synchronous delay circuit 102. Further, the reference clock 108 enters the first and second synchronous delay circuits 101, 102. When the data 107 is a high-level pulse, the first synchronous delay circuit 101 outputs the first clock A the timing whereof is synchronized to the rising edge of the data 107. When the data 107 is a low-level pulse, the second synchronous delay circuit 102 outputs the second clock B the timing whereof is synchronized to the falling edge of the data 107. The pulse combining circuit 5 combines the first and second clocks A, B and outputs the combined signal as the extracted clock 110.

The extracted clock 110 is output to the latch circuit 106, to which the data 107 delayed via the delay circuit 105 is input. The entered data is latched by the latch circuit 106 based upon the timing of the extracted clock 110 and is sent to the next stage as reproduced data 109 together with the extracted clock 110.

It should be noted that the clock recovery circuit shown in FIG. 1 may be implemented by a synchronous delay circuit and ring oscillator in combination.

A first embodiment of the clock recovery circuit according to the present invention will be described with reference to FIG. 2.

[First Embodiment]

FIG. 2A is a circuit diagram illustrating a first embodiment of a clock recovery circuit according to the present invention, and FIG. 2B is a timing chart of various signals associated with the clock recovery circuit shown in FIG. 2A. Components and signals in FIG. 2A identical with those shown in FIG. 1 are designated by like reference characters.

As shown in FIG. 2A, the clock recovery circuit according to the first embodiment of the present invention includes the first synchronous delay circuit 101, to which the reference clock 108 and the data 107 are input, for outputting the first clock A to the pulse combining circuit 5; the inverter 15, to which the data 107 is input, for inverting the input data 107 and outputting the inverted data; the second synchronous delay circuit 102, to which the reference clock 108 and the signal that is output by the inverter 15 are input, for outputting the second clock B to the pulse combining circuit 5; the delay circuit 105, to which the input data 107 is input, for outputting the input data to the latch circuit 106, which is constituted by a D-F/F, upon delaying the data; the pulse combining circuit 5, to which the first clock A output by the first synchronous delay circuit 101 and the second clock B output by the second synchronous circuit 102 are input, for combining these input clocks and outputting the result as the extracted clock 110; and the latch circuit 106 comprising the D-F/F which, on the basis of the signal output by the pulse combining circuit 5, latches the delayed signal output by the delay circuit 105 and outputs the reproduced data 109.

The first synchronous delay circuit 101 includes a first delay line 101A constituted by at least one first individual delay circuit 101AT; a first selection circuit array 103 constituted by at least one first individual selection circuit 103T; and a first NAND gate 51 for executing a NAND operation. The pulse combining circuit 5 preferably is implemented by a NAND gate for performing a NAND operation in order to execute the pulse combining operation accurately and with facility.

The reference clock 108 enters the first delay line 101A and is delayed by this delay line while being transmitted therethrough.

The data 107 enters the first selection circuit array 103. Each first individual selection circuit 103T constituting the first selection circuit array 103 is rendered conductive if the data 107 is at the high logic level, whereby the reference clock 108 output by each first individual delay circuit 101AT constituting the first delay line 101A is allowed to pass and be output to the NAND gate 51.

The NAND gate 51 takes the NAND between the data 107 and a reference clock output by the first selection circuit array 103 (i.e., a first generated reference clock originating from the reference clock 108 via the first delay line) and outputs the result of the NAND operation to the pulse combining circuit 5 as the first clock A.

The second synchronous delay circuit 102 includes a second delay line 102A constituted by at least one second individual delay circuit 102AT; a second selection circuit array 104 constituted by at least one second individual selection circuit 104T; and a second NAND gate 52 for executing a NAND operation.

The reference clock 108 enters the second delay line 102A and is delayed by this delay line while being transmitted therethrough.

A signal (inverted data) obtained by inversion of the data 107 by the inverter 15 enters the second selection circuit array 104. Each second individual selection circuit 104T constituting the second selection circuit array 104 is rendered conductive if the input signal is high, i.e., if the data 107 is at the low logic level, whereby the reference clock 108 output by each second individual delay circuit 102AT constituting the second delay line 102A is allowed to pass and be output to the NAND gate 52.

The NAND gate 52 takes the NAND between the signal (inverted data) obtained by inverting the data 107 and the reference clock 108 output by the second selection circuit array 104 and outputs the result of the NAND operation to the pulse combining circuit 5 as the second clock B.

Thus, in the first embodiment illustrated in FIG. 2A, the clock recovery circuit is composed of the first synchronous delay circuit 101, second synchronous delay circuit 102, delay circuit 105 and latch circuit 106, which is constituted by a D-F/F. The data 107 enters the first synchronous delay circuit 101 and, upon being inverted by the inverter 15, enters the second synchronous delay circuit 102.

The reference clock 108 enters both the first synchronous delay circuit 101 and second synchronous delay circuit 102. When the data is a high-level pulse, the first synchronous delay circuit 101 outputs the first clock A the timing whereof is synchronized to the rising edge of the data 107. When the data 107 is a low-level pulse, the second synchronous delay circuit 102 outputs the second clock B the timing whereof is synchronized to the falling edge of the data 107. The pulse combining circuit 5 combines the first and second clocks A, B and outputs the combined signal as the extracted clock 110.

As mentioned above, the first synchronous delay circuit 101 is constituted by the first delay line 101A and first selection circuit array 103, and the second synchronous delay circuit 102 is constituted by the second delay line 102A and second selection circuit array 104. Accordingly, since the first synchronous delay circuit 101 and second synchronous delay circuit 102 are substantially similar in terms of their construction and operation, only the operation of the first synchronous delay circuit 101 will be described in further detail.

The reference clock 108 and data 107 enter the first synchronous delay circuit 101, as set forth above. The reference clock 108 enters the first delay line 101A and travels along the first delay line 101A as is. When the data 107 undergoes a transition from the low to the high level during this time, one of the first individual selection circuits 103T (of the first selection circuit array 103) that is located at the current position of the reference clock 108 is rendered conductive. As a result, the reference clock 108 exits to the NAND gate 51 from this position of the selection circuit array. The NAND gate 51, which is for executing the NAND operation, allows the reference clock 108 (more exactly, first generated reference clock) to pass and be output to the pulse combining circuit 5 during the time that the data 107 is at the high level.

The extracted clock 110 output by the pulse combining circuit 5 is delivered to the latch circuit 106, to which the data 107 is input via the delay circuit 105. On the basis of the extracted clock 110, the latch circuit 106 latches the data 107 and sends the data to the next stage as the reproduced data 109 along with the extracted clock 110.

The timing of each signal in the first embodiment of the clock recovery circuit according to the present invention shown in FIG. 2A will be described with reference to FIG. 2B, which is a timing chart of the associated signals.

FIG. 2B illustrates the timings of the reference clock 108, data 107, first clock A, second clock B, extracted clock 110 and reproduced data 109.

As shown in FIG. 2B, the first clock A is output in synchronization with the rising edge of the reference clock 108 while the data 107 is at the high logic level, and the second clock B is output in synchronization with the falling edge of the reference clock 108 while the data 107 is at the low logic level. The extracted clock 110 is synchronized to the data 107, and so is the reproduced data 109.

In accordance with the first embodiment, therefore, the synchronization of the extracted clock 110 to the data 107 in the clock recovery circuit is implemented by logic circuitry. As a result, synchronization error attendant upon voltage fluctuation or the like does not readily occur and synchronization time can be shortened.

[Second Embodiment]

Figure 3B:
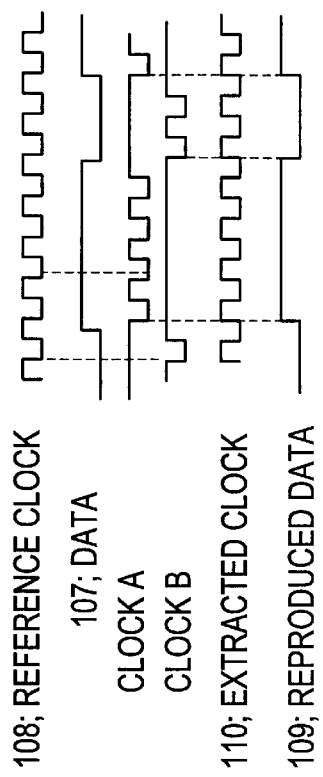
FIG. 3B is a timing chart of various signals associated with the clock recovery circuit shown in FIG. 3A.

A second embodiment of a clock recovery circuit according to the present invention will be described with reference to FIGS. 3A and 3B. FIG. 3A is a circuit diagram illustrating a second embodiment of a clock recovery circuit according to the present invention, and FIG. 3B is a timing chart of various signals associated with the clock recovery circuit shown in FIG. 3A. Components and signals in FIGS. 3A and 3B identical with those of the first embodiment shown in FIGS. 2A and 2B are designated by like reference characters.

As shown in FIG. 3A, the clock recovery circuit according to the second embodiment of the present invention includes the first synchronous delay circuit 101 to which the reference clock 108 and the data 107 are input; the second synchronous delay circuit 102, to which the reference clock 108 and a signal obtained by inversion of the data 107 by the inverter 15 are input; the inverter 15 for inverting the input data 107 and outputting the inverted data; the pulse combining circuit 5 for combining the first clock A output by the first synchronous delay circuit 101 and the second clock B output by the second synchronous circuit 102 and outputting the result as the extracted clock 110; the delay circuit 105, to which the input data 107 is input, for outputting the input data upon delaying the data; and the latch circuit 106 comprising the D-F/F which, on the basis of the timing of the extracted clock 110, latches the data output by the delay circuit 105 and outputs the reproduced data 109.

The first synchronous delay circuit 101 includes the first delay line 101A (connected in the ordinary order in series) constituted by at least one first individual delay circuit 101AT; the first selection circuit array 103 constituted by at least one first individual selection circuit 103T; a first delay line 101B (connected in the reversed order in series) constituted by at least one first individual delay circuit 101BT; and the first NAND gate 51 for executing a NAND operation. The pulse combining circuit 5 preferably is implemented by a NAND gate for performing a NAND operation in order to execute the pulse combining operation accurately and with facility.

The reference clock 108 enters the first delay line 101A of the first synchronous delay circuit 101 and is delayed by this delay line while being transmitted therethrough.

The data 107 and the reference clock 108 enter the first selection circuit array 103. Each first individual selection circuit 103T constituting the first selection circuit array 103 is rendered conductive if the data 107 is at the high logic level, whereby the reference clock 108 output by the respective first individual delay circuit 101AT constituting the first delay line 101A (ordinary order of connection in series) is output to the first delay line 101B (reverse order of connection in series).

The reference clock 108 output to the first delay line 101B is transmitted upon being delayed thereby, and the output signal of the first individual delay line 101B is delivered to the NAND gate 51. The signal delivery to the NAND gate 51 is done via the first individual delay circuit of the last order of connection (leftmost one in FIG. 3A) corresponding to the first order of connection of the first individual delay circuit.

The NAND gate 51, to which the data 107 and the output signal from the first delay line 101B are input, takes the NAND between these signals and outputs the result of the NAND operation to the pulse combining circuit 5 as the first clock A.

The second synchronous delay circuit 102 includes the second delay line 102A constituted by at least one second individual delay circuit 102AT; the second selection circuit array 104 constituted by at least one second individual selection circuit 104T; a second delay line 102B constituted by at least one second individual delay circuit 102BT; and the NAND gate 52 for executing a NAND operation.

The reference clock 108 enters the second first delay line 102A of the second synchronous delay circuit 102 and is delayed by this delay line while being transmitted therethrough.

A signal obtained by inversion of the data 107 by the inverter 15 enters the second selection circuit array 104. Each second individual selection circuit 104T constituting the second selection circuit array 104 is rendered conductive if the input signal is high, i.e., if the data 107 is at the low logic level, whereby the reference clock 108 output by the respective second individual delay circuit 102AT constituting the second delay line 102A is output to the second delay line 102B.

The reference clock 108 output to the second delay line 102B is transmitted along the second delay line 102B and the output of the second delay line 102B is delivered to the NAND gate 52.

The NAND gate 52, to which the signal obtained by inversion of the data 107 by the inverter and the output signal from the second individual delay line 102B are input, takes the NAND between these signals and outputs the result of the NAND operation to the pulse combining circuit 5 as the second clock B.

Thus, in the second embodiment illustrated in FIG. 3A, the clock recovery circuit is composed of the first synchronous delay circuit 101, second synchronous delay circuit 102, delay circuit 105 and latch circuit 106, in a manner similar to that of the first embodiment. The second synchronous delay circuit 102 acts in complementary fashion with the first synchronous delay circuit as regards the H/L relation of the data.

The data 107 enters the first synchronous delay circuit 101 and, after being inverted by the inverter 15, enters the second synchronous delay circuit 102. The reference clock 108 enters both the first and second synchronous delay circuits 101, 102. When the data 107 is a high-level pulse, the first synchronous delay circuit 101 outputs the first clock A the timing whereof is synchronized to the rising edge of the data 107. When the data 107 is a low-level pulse, the second synchronous delay circuit 102 outputs the second clock B the timing whereof is synchronized to the falling edge of the data 107. The pulse combining circuit 5 combines the first and second clocks A, B and outputs the combined signal as the extracted clock 110.

According to the second embodiment, the first synchronous delay circuit 101 is constituted by the first delay line 101A, first selection circuit array 103 and first delay line 101B, and the second synchronous delay circuit 102 is constituted by the second delay line 102A, second selection circuit array 104 and second delay line 102B. Accordingly, since the first synchronous delay circuit 101 and second synchronous delay circuit 102 are substantially similar in terms of their construction and operation (provided that the connecting order of individual delay circuits is reversed), only the operation of the first synchronous delay circuit 101 will be described in further detail.

The reference clock 108 and data 107 enter the first synchronous delay circuit 101, as set forth above. The reference clock 108 enters the first delay line 101A and travels along the first delay line 101A as is. When the data 107 undergoes a transition from the low to the high level during this time, one first individual selection circuit 103T of the first selection circuit array 103 that is located at the current position of the reference clock 108 is rendered conductive.

The reference clock 108 that does not pass through the first delay line 101A exits to the NAND gate 51 through the first delay line 101B from the abovementioned position of the selection circuit array 103. During the time that the data 107 is at the high level, the NAND gate 51 allows the reference clock 108 to pass and outputs the first clock A to the pulse combining circuit 5.

The pulse combining circuit 5 outputs the extracted clock 110, which is delivered to the latch circuit 106 constituted by the D-F/F. The data 107 enters the latch circuit 106 via the delay circuit 105 and is latched on the basis of the extracted clock 110. The latched data is sent to the next stage as the reproduced data 109 together with the extracted clock 110.

The timing of each signal in the second embodiment of the clock recovery circuit according to the present invention shown in FIG. 3A will be described with reference to FIG. 3B, which is a timing chart of the associated signals.

FIG. 3B illustrates the timings of the reference clock 108, data 107, first clock A, second clock B, extracted clock 110 and reproduced data 109.

As shown in FIG. 3B, the first clock A is output in synchronization with the rising edge of the reference clock 108 while the data 107 is at the high logic level, and the second clock B is output in synchronization with the falling edge of the reference clock 108 while the data 107 is at the low logic level. Accordingly, the extracted clock 110 is synchronized to the data 107, and so is the reproduced data 109.

In accordance with the second embodiment, therefore, the synchronization of the extracted clock 110 to the data 107 in the clock recovery circuit is implemented by logic circuitry. As a result, synchronization error attendant upon voltage fluctuation or the like does not readily occur and synchronization time can be shortened.

[Third Embodiment]

A third embodiment of a clock recovery circuit according to the present invention will be described with reference to FIGS. 4A and 4B. FIG. 4A is a circuit diagram illustrating a third embodiment of a clock recovery circuit according to the present invention, and FIG. 4B is a timing chart of various signals associated with the clock recovery circuit shown in FIG. 4A. Components and signals in FIGS. 4A and 4B identical with those of the first embodiment shown in FIGS. 2A and 2B are designated by like reference characters.

As shown in FIG. 4A, the clock recovery circuit according to the third embodiment of the present invention includes a synchronous delay circuit 100 to which the reference clock 108 is input; a first oscillator 101H, to which the data 107 is input, for outputting the first clock A; a second oscillator 102H, to which a signal (inverted data) obtained by inversion of the data 107 by the inverter 15 is input, for outputting the second clock B; the inverter 15, to which the data 107 is input, for inverting the data and then outputting the inverted data; the pulse combining circuit 5 for combining the first clock A and the second clock B and outputting the result as the extracted clock 110; the delay circuit 105, to which the data 107 is input, for outputting this input data upon delaying it; and the latch circuit 106 comprising the data-type flip-flop, having a data terminal to which the extracted clock 110 output by the pulse combining circuit 5 is input, in response to which the data-type flip-flop latches the data output by the delay circuit 105 and outputs the latched data as the reproduced data.

The synchronous delay circuit 100 includes a first delay line 100A constituted by at least one first individual delay circuit 100T; and a first selection circuit array 100S constituted by at least one first individual selection circuit 100ST. The pulse combining circuit 5 preferably is implemented by a NAND gate for performing a NAND operation in order to execute the pulse combining operation accurately and with facility.

The first oscillator 101H includes the first selection circuit array 103 constituted by at least one first individual selection circuit 103T (ordinary order of series connection); the first delay line 101A constituted by at least one first individual delay circuit 101AT; and a first NAND gate 53 for executing a NAND operation.

The second oscillator 102H includes the second selection circuit array 104 constituted by at least one second individual selection circuit 104T (reverse order of series connection); the second delay line 102A constituted by at least one second individual delay circuit 102AT; and a NAND gate 54 for executing a NAND operation.

The reference clock 108 enters the first delay line 100A of the synchronous delay circuit 100 and is transmitted along the first delay line 100A while being delayed thereby. Further, the reference clock 108 enters the first selection circuit array 100S of the synchronous delay circuit 100 as well, and the signal output by each first individual selection circuit 100ST constituting the first selection circuit array 100S enters the first and second oscillators 101H, 102H.

The data 107 is input to the NAND gate 53 of the first oscillator 101H. Further, the signal output by each first individual selection circuit 100ST constituting the first selection circuit array 100S of the synchronous delay circuit 100 is input to a respective one of the first individual selection circuits 103T constituting the first selection circuit array 103 of the first oscillator 101H. The output signal of the NAND gate 53 also is input to each first individual selection circuit 103T constituting the first selection circuit array 103 of the first oscillator 101H. The signal output by each first individual selection circuit 103T constituting the first selection circuit array 103 of the first oscillator 101H is input to the first delay line 101A constituted by at least one first individual delay circuit 101AT. The signal input to the first delay line 101A is output to the NAND gate 53.

The data 107 and the signal that is output by the first delay line 101A enter the NAND gate 53, which proceeds to take the NAND operation between these signals and output the first clock A to the pulse combining circuit 5.

The signal (inverted data) obtained by inversion of the data 107 by the inverter 15 is input to the NAND gate 54 of the second oscillator 102H. Further, the signal output by the first selection circuit array 100S of the synchronous delay circuit 100 enters the second selection circuit array 104 constituted by at least one second individual selection circuit 104T of the second oscillator 102H. In addition, the output signal from the NAND gate 54 enters the second individual selection circuits 104T constituting the second selection circuit array 104.

The signal output by the second selection circuit array 104 enters the second delay line 102A. The signal on the second delay line 102A is output to the NAND gate 54.

Thus, the third embodiment differs somewhat from the first and second embodiments and is constituted by the synchronous delay circuit 100, first oscillator 101H, second oscillator 102H, delay circuit 105 and latch circuit 106.

The operation of the clock recovery circuit according to the third embodiment will now be described in detail.

The data 107 enters the first oscillator 101H and the signal obtained by inverting the data 107 enters the second oscillator 102H. The reference clock 108 enters the synchronous delay circuit 100. The number of elements constituting the first and second oscillators 101H, 102H and the oscillation period thereof are decided by the pulse interval of two successive pulses.

When the data 107 is a high-level pulse, the first oscillator 101H outputs the first clock A the timing whereof is synchronized to the rising edge of the data 107. When the data 107 is a low-level pulse, the second oscillator 102H outputs the second clock B the timing whereof is synchronized to the falling edge of the data 107. The pulse combining circuit 5 combines the first and second clocks A, B and outputs the combined signal as the extracted clock 110.

As in the first and second embodiments, the extracted clock 110 is output to the latch circuit 106 constituted by the D-F/F, to which the data 107 is input via the delay circuit 105. The entered data is latched by the latch circuit 106 based upon the extracted clock 110 and is sent to the next stage as the reproduced data 109 together with the extracted clock 110.

The timing of each signal in the third embodiment of the clock recovery circuit according to the present invention shown in FIG. 4A will be described with reference to FIG. 4B, which is a timing chart of the associated signals.

FIG. 4B illustrates the timings of the reference clock 108, data 107, first clock A, second clock B, extracted clock 110 and reproduced data 109.

As shown in FIG. 4B, the first clock A is output in synchronization with the rising edge of the reference clock 108 while the data 107 is at the high logic level, and the second clock B is output in synchronization with the falling edge of the reference clock 108 while the data 107 is at the low logic level. Accordingly, the extracted clock 110 is synchronized to the data 107, and so is the reproduced data 109.

In accordance with the third embodiment, therefore, the synchronization of the extracted clock 110 to the data 107 in the clock recovery circuit is implemented by logic circuitry. As a result, synchronization error attendant upon voltage fluctuation or the like does not readily occur and synchronization time can be shortened.

[Fourth Embodiment]

Figure 5A:
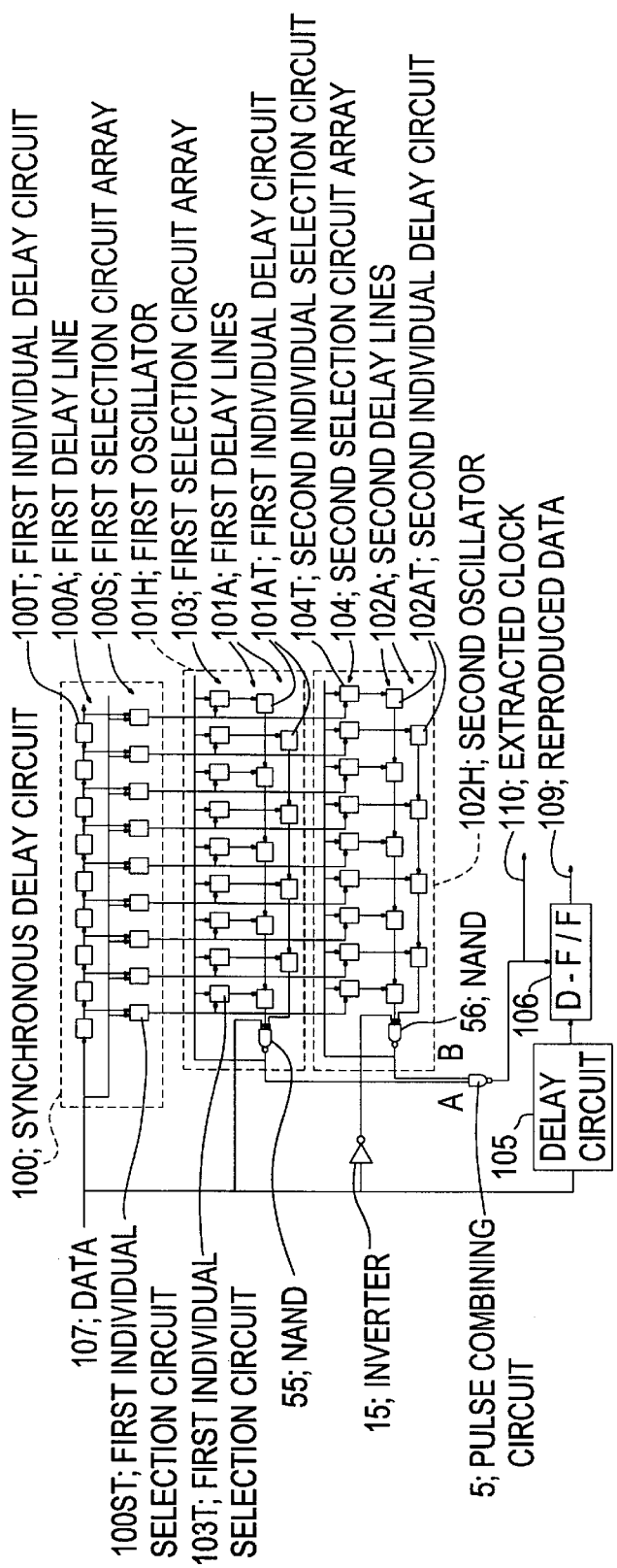
FIG. 5A is a circuit diagram illustrating a fourth embodiment of a clock recovery circuit according to the present invention.
Figure 5B:
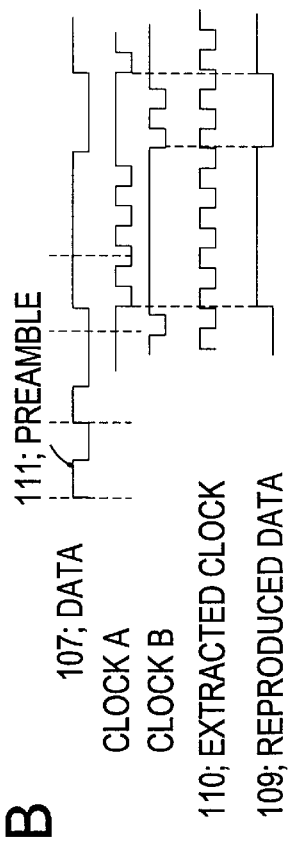
FIG. 5B is a timing chart of various signals associated with the clock recovery circuit shown in FIG. 5A.
Figure 6:
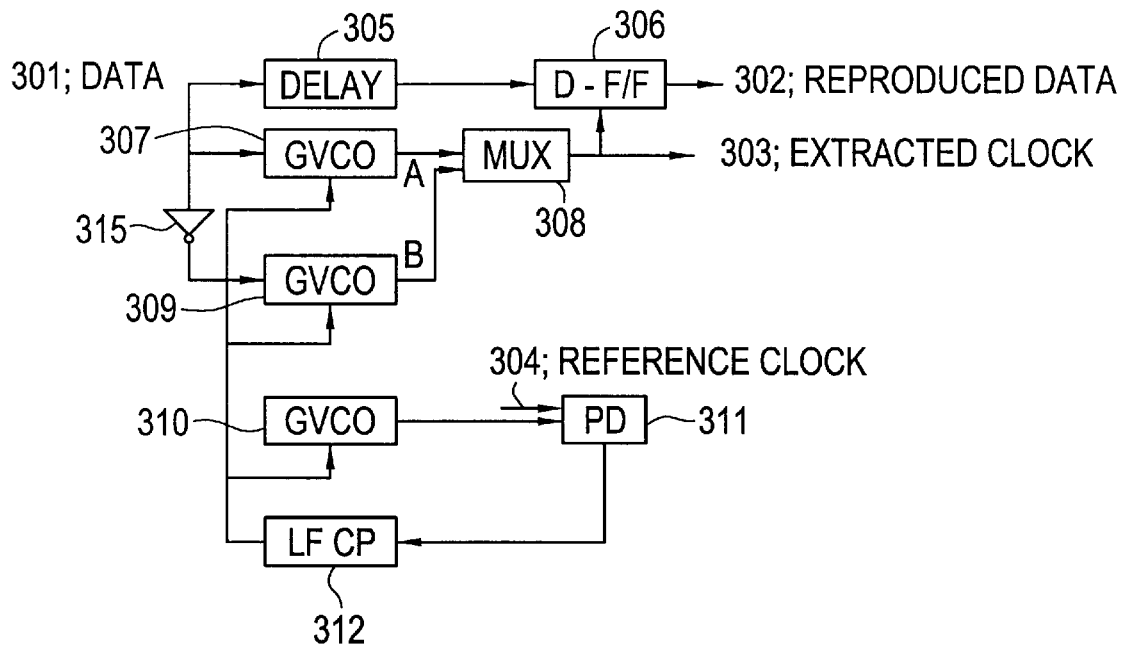
FIG. 6 is a block diagram showing a clock recovery circuit according to the prior art.
Figure 7:
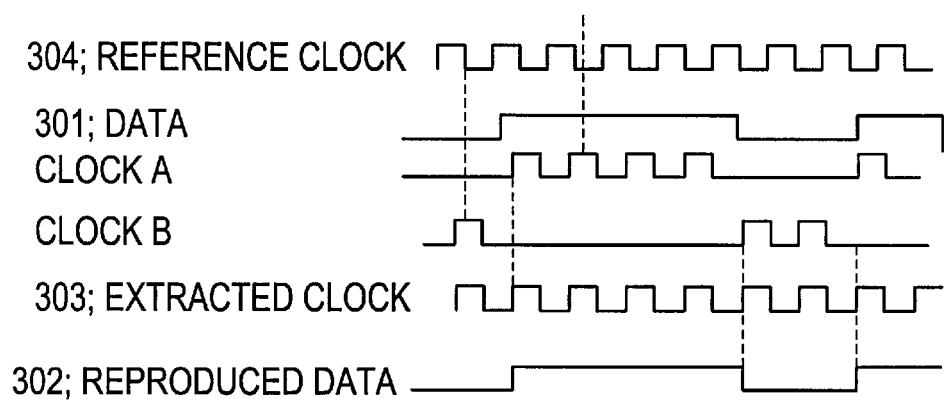
FIG. 7 is a timing chart of various signals associated with the clock recovery circuit according to the prior art shown in FIG. 6.

A fourth embodiment of a clock recovery circuit according to the present invention will be described with reference to FIGS. 5A and 5B. FIG. 5A is a circuit diagram illustrating a fourth embodiment of a clock recovery circuit according to the present invention, and FIG. 5B is a timing chart of various signals associated with the clock recovery circuit shown in FIG. 5A. Components and signals in FIGS. 5A and 5B identical with those of the third embodiment shown in FIGS. 4A and 4B are designated by like reference characters.

As shown in FIG. 5A, the clock recovery circuit according to the fourth embodiment of the present invention includes the synchronous delay circuit 100 to which the data 107 is input; the first oscillator 101H, to which the data 107 is input, for outputting the first clock A; the inverter 15 for inverting and then outputting the data 107; the second oscillator 102H, to which a signal obtained by inversion of the data 107 by the inverter 15 is input, for outputting the second clock B; the pulse combining circuit 5 for combining the first clock A and the second clock B and outputting the result as the extracted clock 110; the delay circuit 105, to which the data 107 is input, for outputting this input data upon delaying it; and the latch circuit 106 comprising the data-type flip-flop, having a data terminal to which the extracted clock 110 output by the pulse combining circuit 5 is input.

The synchronous delay circuit 100 includes the first delay line 100A constituted by at least one first individual delay circuit 100T; and the first selection circuit array 100S, to which the signal output by each first individual delay circuit 100T constituting the first delay line 100A is input, constituted by at least one first individual selection circuit 100ST. The pulse combining circuit 5 preferably is implemented by a NAND gate for performing a NAND operation in order to execute the pulse combining operation accurately and with facility.

The first oscillator 101H includes the first selection circuit array 103 constituted by at least one first individual selection circuit 103T; two first delay lines 101A, to each of which a signal output by each first individual selection circuit 103T constituting the first selection circuit array 103 is input, each constituted by at least one first individual delay circuit 101AT; and a NAND gate 55 for executing a NAND operation.

The second oscillator 102H includes the second selection circuit array 104, to which a signal output by the first selection circuit array 100S is input, constituted by at least one second individual selection circuit 104T; two second delay lines 102A, to each of which a signal output by each second individual selection circuit 104T constituting the second selection circuit array 104 is input, each constituted by at least one second individual delay circuit 102AT; and a NAND gate 56 for executing a NAND operation.

The data 107 enters the first delay line 100A of the synchronous delay circuit 100 and is transmitted along the first delay line 100A while being delayed thereby. Further, the signal output by each first individual delay circuit 100T constituting the first delay line 100A and the data 107 enter the first selection circuit array 100S, and each first individual selection circuit 100 ST constituting the first selection circuit array 100S outputs its signal to the first and second oscillators 101H, 102H.

The data 107 is input to the NAND gate 55 of the first oscillator 101H. Further, each signal output by the first selection circuit array 100S of the synchronous delay circuit 100 is input to the first selection circuit array 103 of the first oscillator 101H, and the signals output by the first individual selection circuits 103T constituting the first selection circuit array 103 enter the two first delay lines 101A alternatively. The signals on the two first delay lines 101A are output to the NAND gate 55. The latter outputs the first clock A to the pulse combining circuit 5.

The connection order of the first and second delay lines are opposite to that of the first and second individual selection circuits, respectively. Thus the last one of the first or second individual delay circuits corresponds to the first one of the first individual selection circuits. This connection order is analogous to FIG. 3A and FIG. 4A. Thus the first appearing change will result in change at corresponding step.

A signal (inverted data) obtained by inversion of the data 107 by the inverter 15 is input to the second oscillator 102H. Further, each signal output by the first selection circuit array 100S of the synchronous delay circuit 100 is input to the second selection circuit array 104 of the second oscillator 102H, and the signals output by the second individual selection circuits 104T constituting the second selection circuit array 104 enter the two second delay lines 102A alternatively. The signals on the two second delay lines 102A are output to the NAND gate 56. The latter outputs the second clock B to the pulse combining circuit 5.

The first clock A output by the first oscillator 101H and the second clock B output by the second oscillator 102H enter the pulse combining circuit 5, which proceeds to combine clocks and output the result as the extracted clock 110.

Thus, as with the case of the third embodiment, the clock recovery circuit according to the fourth embodiment includes the synchronous delay circuit 100, first oscillator 101H, second oscillator 102H, delay circuit 105 and latch circuit 106. The data enters the first oscillator 101H and, after being inverted, enters the second oscillator 102H.

In the fourth embodiment, however, the reference clock 108 does not exist. The number of elements constituting the first and second delay lines 101A, 102A in the first and second oscillators 101H, 102H and the oscillation period are determined so as to obtain a period that is half (in the illustrated embodiment) the minimum pitch of the data 107 input to the synchronous delay circuit 100. A shorter period than this period may be selected, however, with an increased number of the elements.

The operation of the clock recovery circuit according to the fourth embodiment will now be described in detail.

When the data 107 is a high-level pulse, the first oscillator 101H outputs the first clock A the timing whereof is synchronized to the rising edge of the data 107. When the data 107 is a low-level pulse, the second oscillator 102H outputs the second clock B the timing whereof is synchronized to the falling edge of the data 107. The pulse combining circuit 5 combines the first and second clocks A, B and outputs the combined signal as the extracted clock 110.

As in the first through third embodiments, the extracted clock 110 in the fourth embodiment is output to the latch circuit 106, to which the data 107 is input via the delay circuit 105. The entered data is latched by the extracted clock 110 and is sent to the next stage as the reproduced data 109 together with the extracted clock 110.

The timing of each signal in the fourth embodiment of the clock recovery circuit according to the present invention shown in FIG. 5A will be described with reference to FIG. 5B, which is a timing chart of the associated signals.

FIG. 5B illustrates the timings of the data 107, first clock A, second clock B, extracted clock 110 and reproduced data 109.

As shown in FIG. 5B, the first clock A is output in synchronization with the rising edge of the reference clock 108 while the data 107 is at the high logic level, and the second clock B is output in synchronization with the falling edge of the reference clock 108 while the data 107 is at the low logic level. The extracted clock 110 is synchronized to the data 107, and so is the reproduced data 109. In addition, the data 107 is provided with a preamble 111.

In accordance with the fourth embodiment, therefore, the synchronization of the extracted clock 110 to the data 107 in the clock recovery circuit is implemented by logic circuitry. As a result, synchronization error attendant upon voltage fluctuation or the like does not readily occur and synchronization time can be shortened.

Thus, in accordance with the present invention, as described above, a clock is reproduced in a synchronous delay circuit from a reference clock and minimal pulses of the data signal or from the smallest pulse pitch of the data signal. As a result, there can be provided a clock recovery circuit in which a synchronized state can be obtained by or until a single minimal data pulse, thus making it possible to shorten synchronization time.

As many apparently widely different embodiments of the present invention can be made without departing from the spirit and scope thereof according to the entire disclosure and the appended claims, it is to be understood that the invention is not limited to the specific embodiments thereof.

What is claimed is:

1. A clock recovery circuit comprising:
   (a) a first synchronous delay circuit, to which a reference clock and data are input, for outputting a first clock;
   (b) an inverter for inverting the data and outputting inverted data;
   (c) a second synchronous delay circuit, to which the reference clock and inverted data are input, for outputting a second clock;
   (d) a delay circuit, to which data is input, for outputting delayed data;
   (e) a pulse combining circuit, to which the first clock and the second clock are input, for combining the first and second clocks and outputting the result as an extracted clock; and
   (f) a data-type flip-flop, having a clock terminal to which the extracted clock is input, for latching the delayed data and outputting the latched data as reproduced data;
   (g) wherein said first synchronous delay circuit comprises:
   (g1) a first delay line, to which the reference clock is input, comprising at least one first individual delay circuit;
   (g2) a first selection circuit array comprising at least one first individual selection circuit, to which the reference clock output by a respective one of the first individual delay circuits is input and which is rendered conductive based upon the data, for generating a first generated reference clock; and (g3) a first NAND gate, to which the data and the first generated reference clock are input, for outputting the first clock; and (h) wherein said second synchronous delay circuit comprises:

(h1) a second delay line, to which the reference clock is input, comprising at least one second individual delay circuit;

(h2) a second selection circuit array comprising at least one second individual selection circuit, to which the reference clock output by a respective one of the second individual delay circuits is input and which is rendered conductive based upon the inverted data, for generating a second generated reference clock; and (h3) a second NAND gate, to which the inverted data and the second generated reference clock are input, for outputting the second clock.

2. The clock recovery circuit according to claim 1, wherein said pulse combining circuit is a third NAND gate.

3. A clock recovery circuit comprising:

(a) a first synchronous delay circuit, to which a reference clock and data are input, for outputting a first clock;

(b) an inverter for inverting the data and outputting inverted data;

(c) a second synchronous delay circuit, to which the reference clock and the inverted data are input, for outputting a second clock;

(d) a delay circuit, to which the data is input, for outputting delayed data;

(e) a pulse combining circuit, to which the first clock and the second clock are input, for combining the first and second clocks and outputting the result as an extracted clock; and (f) a data-type flip-flop, having a clock terminal to which the extracted clock is input, for latching the delayed data and outputting the latched data as reproduced data;

(g) wherein said first synchronous delay circuit comprises:

(g1) a first delay line, to which the reference clock is input, comprising at least one first individual delay circuit;

(g2) a first selection circuit array comprising at least one first individual selection circuit, to which the reference clock and the reference clock output by a respective one of the first individual delay circuits are input and which is rendered conductive based upon the data, for generating a first generated reference clock;

(g3) a second delay line, to which the clock output by each first individual selection circuit is input, comprising at least one second individual delay circuit; and (g4) a first NAND gate, to which the data and the first generated reference clock are input; and (h) wherein said second synchronous delay circuit comprises:

(h1) a third delay line, to which the reference clock is input, comprising at least one third individual delay circuit;

(h2) a second selection circuit array comprising at least one second individual selection circuit, to which the reference clock and the reference clock output by a respective one of the third individual delay circuits are input and which is rendered conductive based upon the inverted data, for generating a second generated reference clock;

(h3) a fourth delay line, to which the reference clock output by each second individual selection circuit is input, comprising at least one fourth individual delay circuit; and (h4) a second NAND gate, to which the inverted data and the second generated reference clock are input.

4. The clock recovery circuit according to claim 3, wherein said pulse combining circuit is a third NAND gate.

5. A clock recovery circuit comprising:

(a) a synchronous delay circuit, to which a reference clock is input;

(b) a first oscillator, to which data is input, for outputting a first clock;

(c) an inverter for inverting the data and outputting inverted data;

(d) a second oscillator, to which the inverted data is input, for outputting a second clock;

(e) a pulse combining circuit for combining the first clock and the second clock and outputting the result as an extracted clock;

(f) a delay circuit, to which the data is input, for outputting delayed data; and (g) a data-type flip-flop, having a clock terminal to which the extracted clock is input, for latching the delayed data and outputting the latched data as reproduced data;

(h) wherein said synchronous delay circuit comprises:

(h1) a first delay line, to which the reference clock is input, comprising at least one first individual delay circuit; and (h2) a first selection circuit array comprising at least one first individual selection circuit, to which the reference clock and the reference clock output by a respective one of the first individual delay circuits are input;

(i) wherein said first oscillator comprises:

(i1) a second selection circuit array, to which the reference clock output by each first individual selection circuit is input, comprising at least one second individual selection circuit;

(i2) a second delay line, to which the reference clock output from each second individual selection circuit is input, comprising at least one second individual delay circuit; and (i3) a first NAND gate, to which the data and the reference clock that is output by the second delay line are input, for outputting the first clock to said pulse combining circuit; and (j) wherein said second oscillator comprises:

(j1) a third selection circuit array, to which the reference clock output by each first individual selection circuit is input, comprising at least one third individual selection circuit;

(j2) a third delay line, to which the reference clock output from each third individual selection circuit is input, comprising at least one third individual delay circuit; and (j3) a second NAND gate, to which the inverted data and the reference clock that is output by said third delay line are input, for outputting the second clock to said pulse combining circuit.

6. The clock recovery circuit according to claim 5, wherein said pulse combining circuit is a third NAND gate.

7. A clock recovery circuit comprising:

(a) a synchronous delay circuit, to which data is input;

(b) a first oscillator, to which the data is input, for outputting a first clock;

(c) an inverter, to which the data is input, for outputting inverted data;

(d) a second oscillator, to which the inverted data is input, for outputting a second clock;

(e) a pulse combining circuit, to which the first clock and the second clock are input, for combining the first and second clocks and outputting the result as an extracted clock;

(f) a delay circuit, to which the data is input, for outputting delayed data; and (g) a data-type flip-flop, having a clock terminal to which the extracted clock is input, for latching the delayed data and outputting the latched data as reproduced data;

(h) wherein said synchronous delay circuit comprises:

(h1) a first delay line, to which the data is input, comprising at least one first individual delay circuit; and (h2) a first selection circuit array comprising at least one first individual selection circuit, to which the data and the data output by a respective one of the first individual delay circuit are input;

(i) wherein said first oscillator comprises:

(i1) a second selection circuit array, to which the data output by each first individual selection circuit is input, comprising at least one second individual selection circuit;

(i2) a double second delay line, to which the data output from each second individual selection circuit is input, comprising at least one second individual delay circuit; and (i3) a first NAND gate, to which the inverted data and the data that is output by the double second delay line are input, for outputting the first clock to said pulse combining circuit; and (j) wherein said second oscillator comprises:

(j1) a third selection circuit array, to which the data output by each first individual selection circuit is input, comprising at least one third individual selection circuit;

(j2) a double third delay line, to which the data output from each third individual selection circuit is input, comprising at least one third individual delay circuit; and (j3) a second NAND gate, to which the data and the data that is output by the double third delay line are input, for outputting the second clock to said pulse combining circuit.

8. The clock recovery circuit according to claim 7, wherein said pulse combining circuit is a third NAND gate.

9. A clock recovery circuit comprising:

(a) a first synchronous delay circuit, to which a data signal is input, for outputting a first clock;

(b) an inverter for inverting the data signal and outputting an inverted data signal;

(c) a second synchronous delay circuit, to which the inverted data signal is input, for outputting a second clock;

(d) a delay circuit, to which the data signal is input, for outputting a delayed data signal;

(e) a pulse combining circuit, to which the first clock and the second clock are input, for combining the first and second clocks and outputting the result as an extracted clock; and (f) a data-type flip-flop, having a clock terminal to which the extracted clock is input, for latching the delayed data signal and outputting the latched data signal as a reproduced data signal;

(g) wherein said first and second synchronous delay circuits are mutually complementary synchronous multi-step delay circuits outputting first and second output signals synchronized with the data signal during a period of time which corresponds to a first state and a second state of the data signal, respectively, as a pulse signal having a pulse period substantially shorter than the minimal period of the first and second states of the data signal so as to minimize the time period needed to reach synchronization.

10. The clock recovery circuit according to claim 9, wherein said first and second synchronous delay circuits receive a reference clock for synchronization having said pulse period of the pulse signal.

11. The clock recovery circuit according to claim 10, wherein each of said synchronous multi-step delay circuits comprises an array of individual delay circuits, each connected to a corresponding array of individual selection circuits, and wherein said data signal is supplied to each said array of individual selection circuits for allowing any one of said individual selection circuits to output a generated reference clock which is supplied to a NAND gate that further receives the data signal and outputs the first and second clocks, respectively.

12. The clock recovery circuit according to claim 11, wherein said array of individual selection circuits is connected in the same order as said array of individual delay circuits.

13. The clock recovery circuit according to claim 11, wherein said array of individual selection circuits is connected in a reverse order of said array of individual delay circuits.

14. The clock recovery circuit according to claim 9, wherein said pulse period of the pulse signal is half the minimal period of the first and second states of the data signal.

15. A clock recovery circuit comprising:

(a) a synchronous multi-step delay circuit, to which a reference clock is input;

(b) a first oscillator, to which a data signal is input, for outputting a first clock;

(c) an inverter for inverting the data signal and outputting an inverted data signal;

(d) a second oscillator, to which the inverted data signal is input, for outputting a second clock;

(e) a pulse combining circuit for combining the first clock and the second clock and outputting the result as an extracted clock;

(f) a delay circuit, to which the data signal is input, for outputting a delayed data signal; and (g) a data-type flip-flop, having a clock terminal to which the extracted clock is input, for latching the delayed data signal and outputting the latched data signal as a reproduced data signal;

(h) wherein said synchronous multi-step delay circuit comprises an array of individual delay circuits, each of which provides a generated reference clock to be supplied to each of the first and second oscillators, (i) wherein said first and second oscillators are mutually complementary synchronous oscillators outputting first and second output signals synchronized with the data signal during a period of time which corresponds to a first state and a second state of the data signal, respectively, as a pulse signal having a pulse period substantially shorter than the minimal period of the first and second states of the data signal so as to minimize the time period needed to reach synchronization.

16. A clock recovery circuit comprising:
(a) a synchronous multi-step delay circuit, to which a data signal is input;
(b) a first oscillator, to which the data signal is input, for outputting a first clock;
(c) an inverter, to which the data signal is input, for outputting an inverted data signal;
(d) a second oscillator, to which the inverted data signal is input, for outputting a second clock;
(e) a pulse combining circuit, to which the first clock and the second clock are input, for combining the first and second clocks and outputting the result as an extracted clock;
(f) a delay circuit, to which the data signal is input, for outputting a delayed data signal; and
(g) a data-type flip-flop, having a clock terminal to which the extracted clock is input, for latching the delayed data signal and outputting the latched data as reproduced data signal;
(h) wherein said synchronous multi-step delay circuit comprises an array of individual delay circuits, each of which provides a generated reference clock to be supplied to each of the first and second oscillators,
(i) wherein said first and second oscillators are mutually complementary synchronous oscillators outputting first and second output signals synchronized with the data signal during a period of time which corresponds to a first state and a second state of the data signal, respectively, as a pulse signal having a pulse period substantially shorter than the minimal period of the first and second states of the data signal so as to minimize the time period needed to reach synchronization.

* * * * *